United States Patent
Abraham et al.

(10) Patent No.: US 7,352,169 B2
(45) Date of Patent: Apr. 1, 2008

(54) TESTING COMPONENTS OF I/O PATHS OF AN INTEGRATED CIRCUIT

(75) Inventors: Jais Abraham, Malapuram (IN); Rohit Goel, New-delhi (IN)

(73) Assignee: Texas Instruments Incorporated, Dallas, TX (US)

( * ) Notice: Subject to any disclaimer, the term of this patent is extended or adjusted under 35 U.S.C. 154(b) by 69 days.

(21) Appl. No.: 11/308,931

(22) Filed: May 26, 2006

(65) Prior Publication Data

US 2008/0001616 A1    Jan. 3, 2008

(51) Int. Cl.
  *G01R 31/26*  (2006.01)
(52) U.S. Cl. .................. 324/158.1; 324/763; 324/765; 714/727
(58) Field of Classification Search ...................... None
  See application file for complete search history.

(56) References Cited

U.S. PATENT DOCUMENTS 5,084,874 A * 1/1992 Whetsel, Jr. ................ 714/727
5,490,151 A * 2/1996 Feger et al. ................ 714/727

OTHER PUBLICATIONS

IEEE Standard Test Access Port and Boundary-Scan Architecture, Test Technology Standards Committee of the IEEE Computer Society, pp. 1-200 (Tables of Contents), Approved Jun. 14, 2001, IEEE-SA Standards Board, The Institute of Electrical and Electronics Engineers, Inc. 3 Park Avenue, New York, NY 10016-5997, USA.

* cited by examiner

*Primary Examiner*—Minh N. Tang
(74) *Attorney, Agent, or Firm*—Yingsheng Tung; Wade James Brady, III; Frederick J. Telecky, Jr.

(57) ABSTRACT

Testing the components of I/O paths in an integrated circuit at-speed operation (i.e., the speed at which the integrated circuit would be operated during normal non-test mode). In an embodiment, boundary scan cells of different paths are connected in a scan chain, and each scan cell tests the corresponding component (e.g., buffer) by launching data at a first time instance and receiving the result of the data at a second time instance, with the duration between the first time instance and the second time instance corresponding to the at-speed operation. If the data is received accurately, the component may be deemed to be operating accurately at-speed.

10 Claims, 6 Drawing Sheets

TESTING COMPONENTS OF I/O PATHS OF AN INTEGRATED CIRCUIT

BACKGROUND

1. Field of the Invention

The present invention relates generally to testing of integrated circuits (IC) and more specifically to a method and apparatus for testing I/O paths of a integrated circuit.

2. Related Art

An input/output (I/O) path generally refers to a signal path between a pad (which provides interface to external devices/components) and internal functional logic portion of an integrated circuit (IC). The internal functional logic portion generally provides the desired processing and uses the I/O paths for receiving input signals and sending the output signals.

Each I/O path may be viewed as containing a conductive portions (i.e., intended for merely transferring the signal without delay/distortion, etc.) and components such as buffers (which provide translation of voltage/current levels, impedance matching, power output, etc.), passive elements (inductors, capacitors, etc.).

There is a general need to ensure the desired operation of I/O paths. For example, it may be necessary to ensure that the I/O path accurately transfers the signals received on a pad to the internal functional logic portion and in the other direction as well. Further more, it may be desirable to ensure that the transfer of the signals occur within a desired time specification. Thus, there is a general need to test components of I/O paths as well.

BRIEF DESCRIPTION OF THE DRAWINGS

The present invention will be described with reference to the following accompanying drawings, which are described briefly below.

Figure (FIG.) 1 is a diagram of an example environment in which various aspects of the present invention can be implemented.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

An aspect of the present invention provides for testing of components present in the I/O paths at-speed operation (i.e., the frequency/speed at which the path would be operated in the normal non-test mode). Such a feature is obtained by providing scan cells which can be connected in sequence of a scan chain (with each scan cell being present in a corresponding I/O path) and loaded with desired bit values.

A scan cell then launches the stored bit at a first time instance and receives the output from the corresponding component at a second time instance, with the two time instances being apart by a duration corresponding to the at-speed operation. The received output value is compared with an expected value to determine if the component operates accurately at-speed.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Environment

Figure 1:
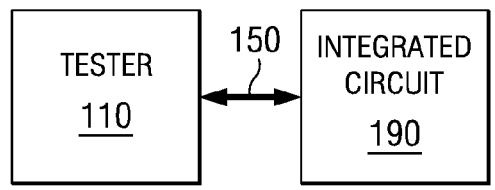

FIG. 1 is a block diagram illustrating an example environment in which various aspects of present invention are implemented. The environment is shown containing tester 110 used for testing integrated circuit (IC) 190 by sending the appropriate signals on path 150.

Path delay ATPG may not provide for testing of many (or all) I/O paths since many of the device pins will be used for providing the functions necessary for scan operations, while the state of other pins might be indeterminable during scan testing. Boundary scan (e.g., based on IEEE 1149.1 JTAG standard) may provide for testing of the components of the desired I/O paths, but not at 'at-speed' operation as described briefly below.

3. Integrated Circuit

Figure 2:
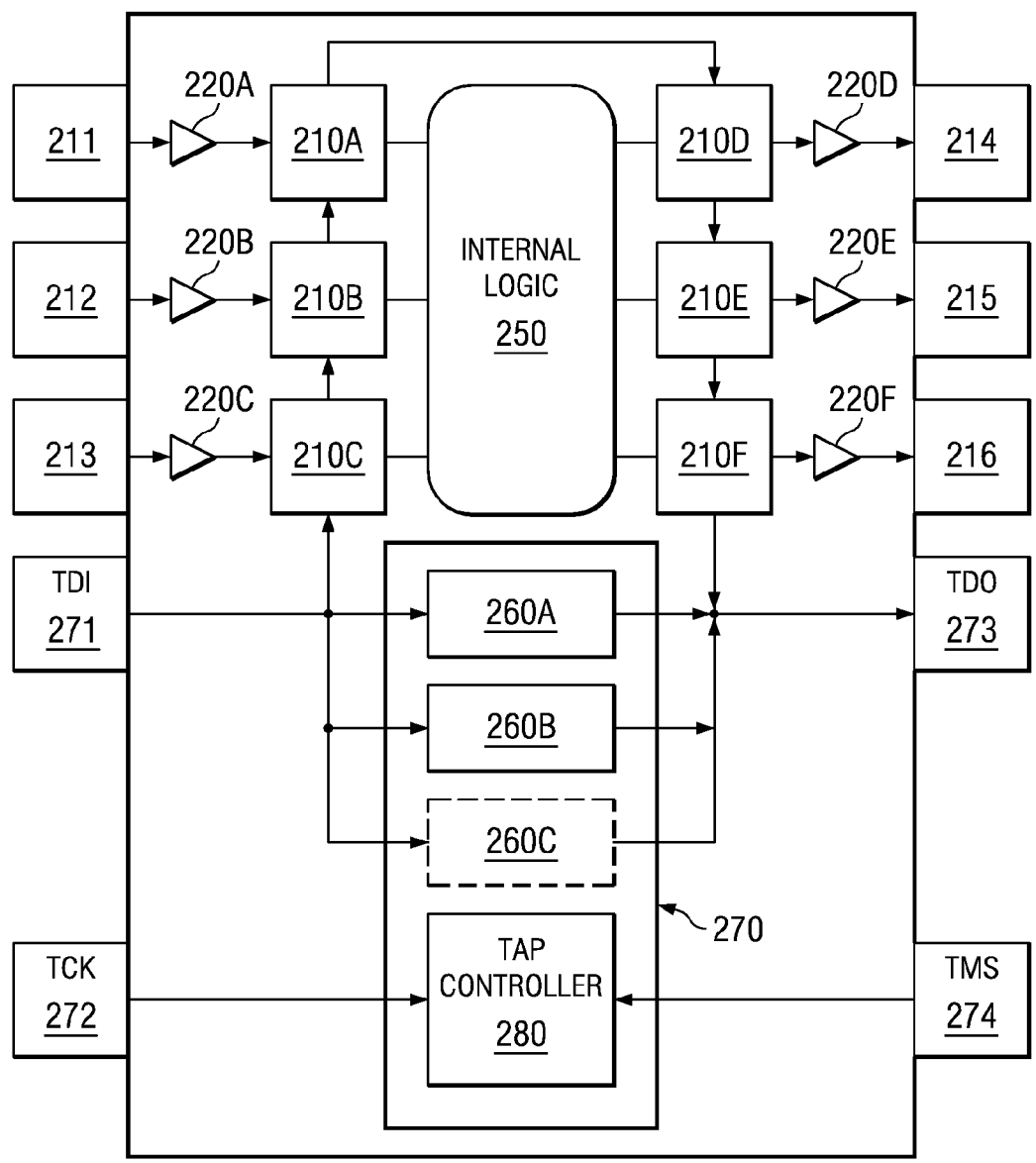
FIG. 2 is a block diagram illustrating the details of an integrated circuit in one embodiment.

FIG. 2 is a block diagram of an integrated circuit illustrating the details as relevant to testing using boundary scan techniques. The integrated circuit is shown containing boundary scan cells 210A-210F, I/O pads 211-216 and 271-274, I/O buffers 220A-220F, internal logic 250, TAP registers 260A-260C, TAP port 270, and TAP controller 280. Each component is described in further detail below.

I/O pads 211-216 provide and physical connectivity and the electrical path to external devices/components, with each pad operating either as an input pad or an output pad. I/O buffers 220A-220G provide the voltage/level/power translation for signals during transfers between the I/O pads and the components of internal logic 250.

Internal logic 250 processes the input signals received from input pads and generates the output signals on the output pad. The internal logic is referred to as internal functional logic in the background section above. The signal path between an I/O pad (e.g., 211) and internal logic 250 is referred to as an I/O path and is shown containing buffer (220A) and scan cell (210A).

Boundary scan cells 210A-210F operate in two configurations—test mode and functional mode. In the functional mode, the signal received from the I/O pads 211-216 (through the corresponding buffers 220A-220F) is connected to the corresponding input of internal logic 250. On the other hand, in test mode, the signal received from the I/O pads 211-216 is either loaded into the scan cell or a desired data/bit from the scan cell is provided to corresponding internal logic input. Manner in which the scan cell operate in functional mode and in test mode is described in sections below.

Tap port 270 provides access to many test support functions built into the integrated circuit (IC) according to JTAG standard noted above. TAP port 270 contains four connecting pads 271-274 with three connecting pads operating as input pads (data in (TDI), clock signal (TCK) and test mode select input (TMS)) and one connecting pad operating as output pad (data out (TDO)). Tap port 270 may also contain an optional input pad TRST (not shown in Diagrams) to reset the state machine.

TAP port 270 is shown containing TAP controller 280 and TAP registers 260A-260C. TAP registers 260A-260C respectively represent two test data registers (the bypass and boundary-scan registers) and an instruction register. The operation of test data registers and instruction register are described in the standards. However, briefly, the TAP controller 280 is a synchronous finite state machine that responds to changes at the TMS and TCK signals. Boundary scan cells 210A-210F are controlled by the signals generated by the TAP port 270 as described below.

4. Prior Boundary Scan Cell

Figure 3A:
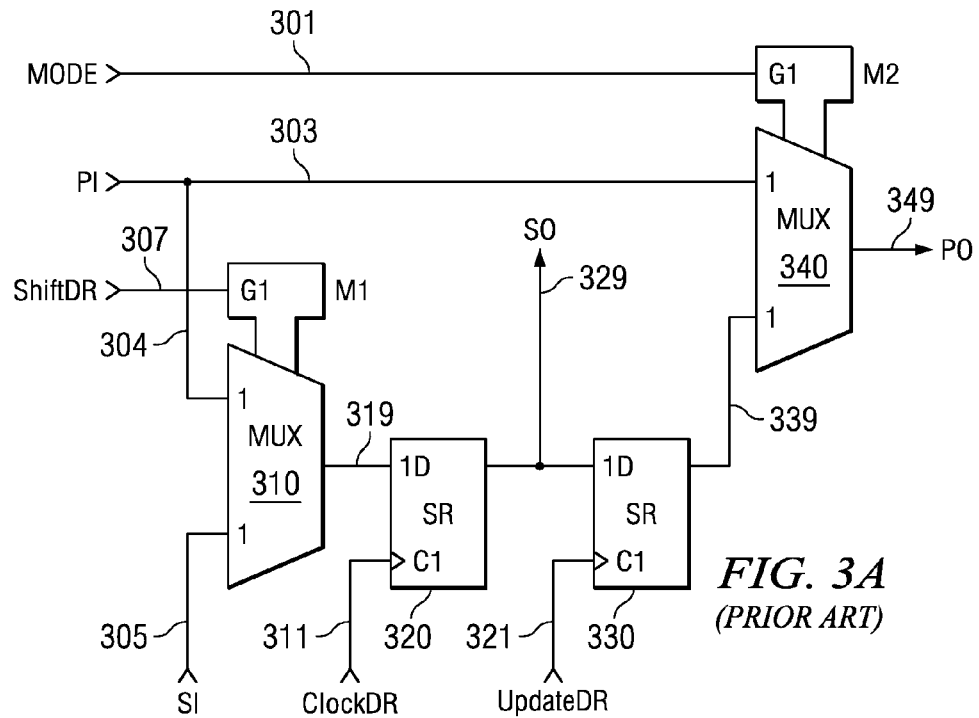
FIGS. 3A and 3B are a circuit diagrams illustrating the details of a boundary scan cell in corresponding prior embodiments.

FIG. 3A is a circuit diagram illustrating the basic structure of a boundary scan cell (known as BC_1 according to the JTAG standard) in one embodiment. The block diagram is shown containing a scan shift register (SR) 320, update register 330, and multiplexers 310 and 340. With respect to FIG. 2, clock signals 311 and 321, shiftDR 307, mode select 301, Scan-in terminal SI 305 are received from TAP port 270, and scan out (SO) 329 is provided to TAP port 270 as an input. All these signals would be provided to each cell, though not shown in FIG. 2.

With respect to the operation, multiplexer 310 selects either signal 303 from I/O pad (211-216) or from previous boundary scan cell (as scan input bit). Scan register 320 latches the output at time points determined by the clock signal 311. The output 329 of scan register 320 is provided to the next scan cell in the chain. In addition, update register 330 latches the output 329 at time points determined by clock signal 321.

Multiplexer 340 selects either signal 303 from I/O pad or output from update register 330 based on mode select 301. When mode select 301 represents a test mode, the output from update register 330 is connected to internal logic 250. When in functional mode, the signal from I/O pad is connected to internal logic 250.

Due to such a structure, the test data (scan vector) may be scanned in through SI 305 of the first scan cell in the scan chain, and then provide the scan vector as input to internal logic 250 for evaluation. Alternatively (or in addition), all the scan cells may be configured to receive the respective data from the I/O pads and the received data may be scanned out through the scan chain. As a result, the I/O paths may be tested for stuck at logic faults.

It may be appreciated that the basic structure of above merely transfers the test bits from input (303) to output (329). However the structure may be extended for more internal testing between I/O pads and internal logic 250, as described below.

Figure 3B:
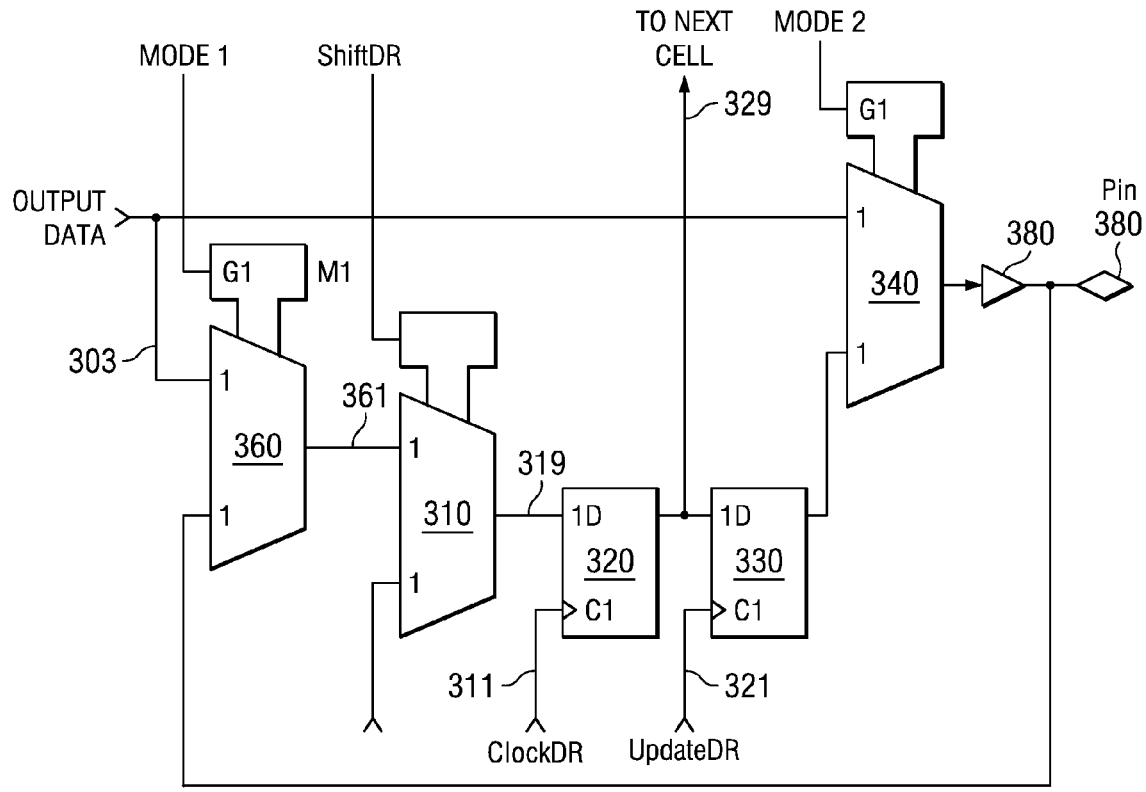

FIG. 3B is a circuit diagram illustrating the combined details of a boundary scan cell and an output buffer in another embodiment (referred to as the BC_9 cell in the JTAG standard). With respect to FIG. 3A, additional components are added to enable internal testing of a portion of the I/O path. While maintaining the same label and reference numeral for similar components (310, 320, 330 and 340), additional components are shown in FIG. 3B. For conciseness, only the differences are described below.

Multiplexer 360 selects either the signal from internal logic 250 on path 303 or output from output buffer 380 (corresponding to one of I/O buffers 220A-220F) based on mode 1 signal (received from TAP port 270). As a result, multiplexer 310 would receive either the signal on path 303 or output from output buffer 380 on one of the input terminals. As a result, the I/O path (containing output buffer 380) can be tested by scanning in the test vector received on path 305.

However, the embodiment of FIG. 3B would not provide for at-speed testing of the output path as described below with respect to the state machine of FIG. 4.

5. State Machine

Figure 4:
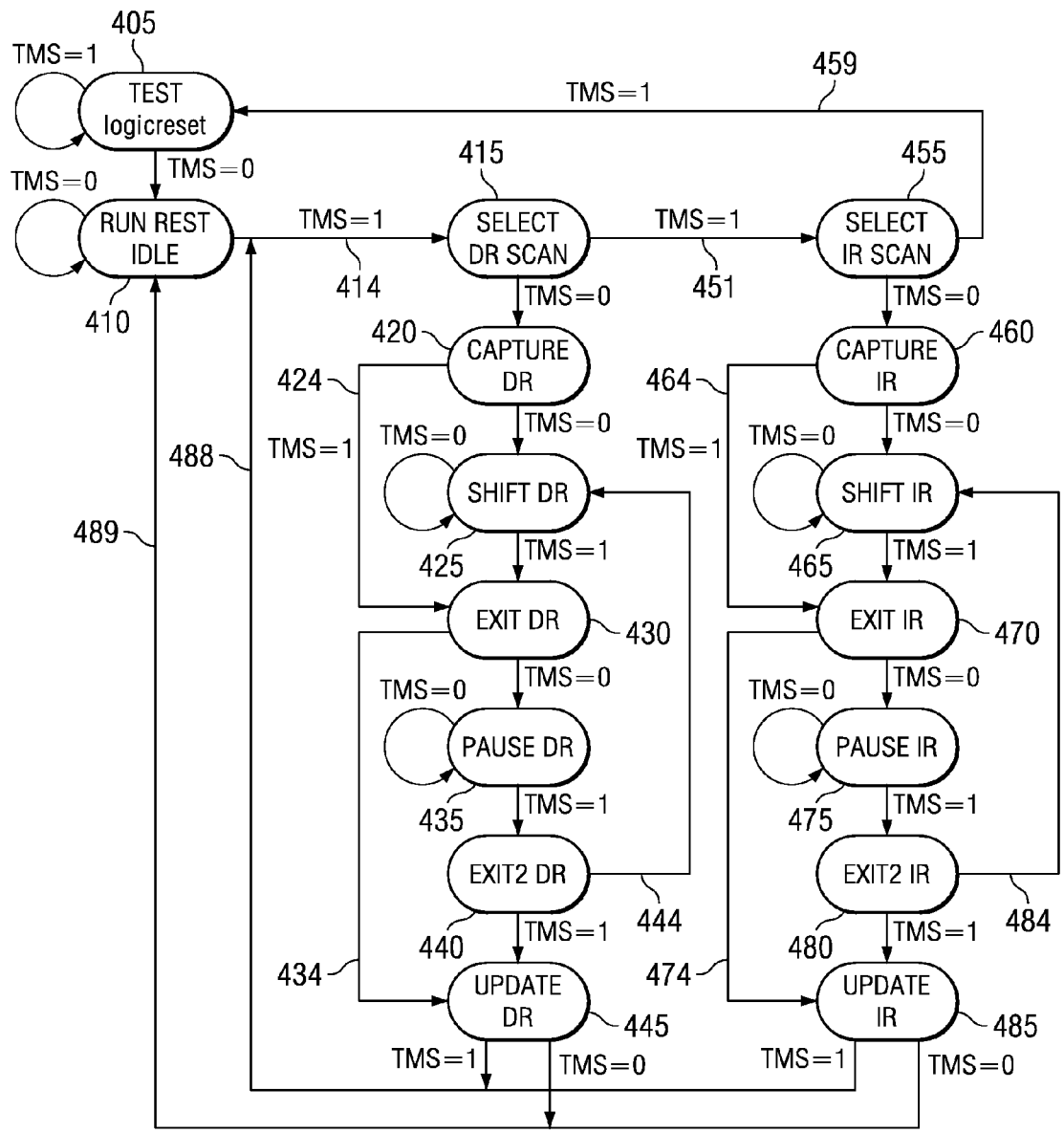
FIG. 4 is a state diagram illustrating the operation in a test mode according to JTAG standard.

FIG. 4 is a state machine illustrating the operation of TAP controller 280 in one embodiment. The state machine is shown containing the states—Only the details as believed to be relevant to understanding why the I/O path is not tested at-speed, are described below. For further information as well as the details of the remaining states, the reader is referred to a section entitled, "6. Tap Controller" in the JTAG Standard (IEEE Std 1149.1-2001) noted above.

In state update DR 445, the test bit (of a scan vector) on path 329 is allowed to be latched onto input of output buffer 380. The response of the output buffer 380 is captured by scan shift register 320 through multiplexer 360 on application of clock pulse 311. Clock pulse 311 to scan shift register 320 is provided in capture state 420.

As a result, it may be appreciated that even if a clock signal is provided at-speed, the state machine of FIG. 4 would require 2.5 times the clock duration to reach the capture state from the update stage. However, the clock duration is generally substantially more to allow for the lower speed of operation of I/O cells. Consequently, the I/O path is not tested at-speed.

Various aspects of the present invention allow the I/O paths to be tested at-speed as described below in further detail.

6. Flow Chart

Figure 5:
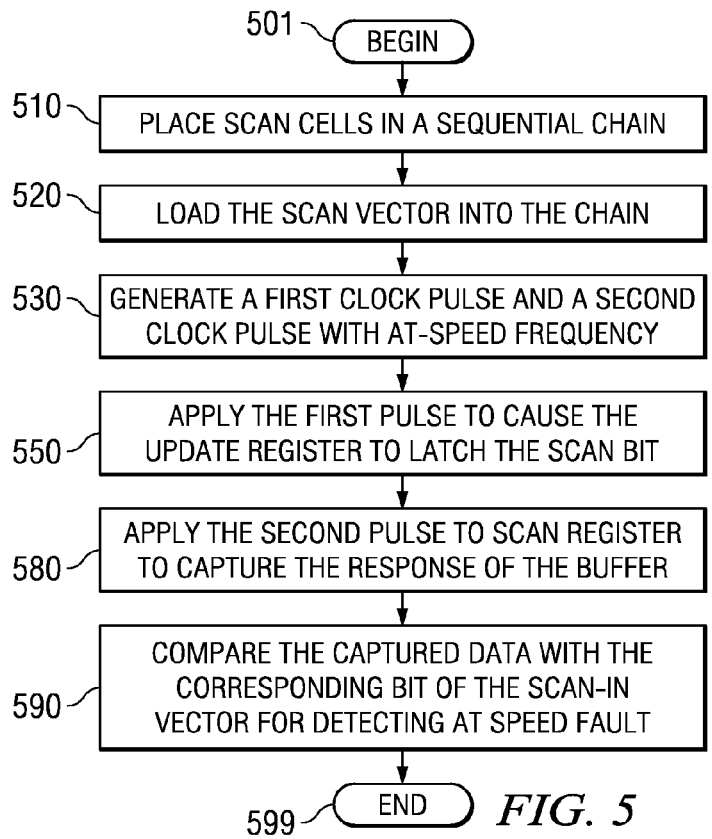
FIG. 5 is a flow chart illustrating the manner in which integrated circuits can be tested according to an aspect of the present invention.

FIG. 5 is a flowchart illustrating the manner in which the components in the I/O paths may be tested at-speed according to an aspect of the present invention. The flowchart is described with respect to FIGS. 3B and 4 for illustration. However, the features can be implemented in other environments as well. The flowchart begins in step 501, in which control passes to step 510.

In step 510, tester 110 places scan cells in a sequential chain, for example, by sending the appropriate control signals via path 150 and I/O pads 271-274. Tap controller 280 would traverse through states 405 and 410 and reach state 415.

In step 520, tester 110 loads the scan vector into the chain formed in step 510. Appropriate data signals may be sent via path 150. The loading of the scan bits into the scan shift register 320 of the individual boundary scan cells 210A-210F. is performed either through test data register or through TDI noted above.

In step 530, tester 110 generates a first clock pulse and a second clock pulse with at-speed frequency. However, the pulses may be generated internally, for example, using the PLLs which would generate at-speed clock signals during normal operation.

In step 550, tester 110 applies the first pulse to cause update register 330 to latch the bit of the scan vector, which causes the bit to be provide as an input to output buffer 380.

In step 580, tester 110 applies the second pulse to scan shift register 320 to capture the response of the buffer.

In step 590, tester 110 compare the captured data with the corresponding bit of the scan-in vector for detecting at speed fault. The flowchart ends in step 599.

Since the input to the buffer is provided at the first clock pulse and the response is captured at the second clock pulse, the buffer is tested at speed (corresponding to the time duration between the two clock pulses). The description is continued with respect to the details of an embodiment of boundary scan cells 210A-210C, which also supports the operation of the flow chart of FIG. 5.

7. Novel Boundary Scan Cell

Figure 6:
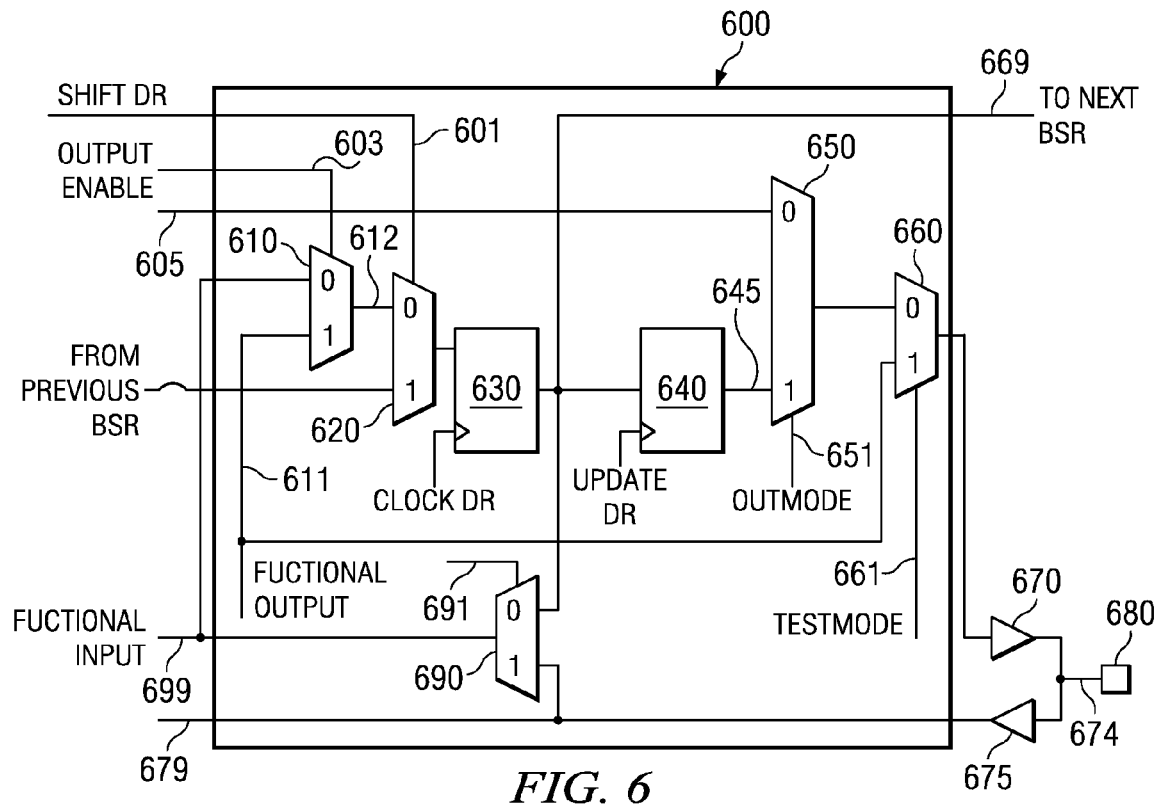
FIG. 6 is a circuit diagram of a boundary scan cell in an embodiment of the present invention.

FIG. 6 is a circuit diagram illustrating the details of boundary scan cell 600 at a bi-directional I/O path according to an aspect of the present invention. Boundary scan cell 600 may correspond to each of boundary scan cells 210A-210F, I/O buffers 670/675 to I/O buffers 220A-220F, and I/O pad 680 to one of I/O pads 211-216. Boundary scan cell 600 is shown containing scan register 630, update register 640, and multiplexers 610, 620, 650, 660 and 690. Each component is described below in further detail.

Boundary scan cell 600 is provided to test a bi-directional I/O path (signal is received from I/O pad and provided to internal logic and an output from internal logic is provided on same I/O pad at different time instance). Accordingly, boundary scan cell 600 is shown receiving an output from functional (Internal) logic 250 on path 611 and shown providing an input to internal logic 250 on path 699.

Buffers 670 and 675 together operate as bi-directional buffers with buffer 670 operating to transfer the signal from internal logic 250 to I/O pad and I/O buffer 675 operating to transfer the signal from I/O pad 680 to internal logic 250. Multiplexer 690 selects either the signal from I/O pad 680 through I/O buffer 675 or data from a scan chain received from scan register 630 according to mode 2 select signal (path 691) also described in the JTAG standard (received from TAP port 270). The selected signal is provided on path 699 to internal logic 250.

Multiplexer 610 provided according to an aspect of the present invention, selects (on path 612) either signal on path 699 or an output from internal (Functional) logic 250 (assuming operation in conjunction with the embodiment of FIG. 2) on path 611 according to the output enable signal received from internal logic 250 (which specifies the time durations in which the I/O path is used for sending or receiving the signal). The selected signal 612 is provided as one of the inputs to multiplexer 620.

Multiplexer 620 selects signal on path 612 or a signal from the previous scan cell (or TDI in case of first scan cell) in the scan chain based on shiftDR signal received from TAP port 270, and the selected signal is provided to scan register 630. Scan register 630 latches the output of multiplexer 620 when clockDR pulse is applied in the capture state 420 of TAP controller 280. The latched output is provided to next scan cell in the scan chain on path 669, to update register 640 and also to multiplexer 690.

Update register 640 latches the output from scan register 630 when updateDR clock pulse is applied. The time instance at which the updateDR clock pulse is applied to test the output path at-speed, is described below with respect to FIG. 7. Output of update register 640 is provided on path 645.

Multiplexer 650 selects either the signal on path 645 or an input from internal logic 250 on path 605 based on the signal outmode on path 651. Signal Outmode on path 651 is provided by TAP controller 280 for providing the output of scan register 630 onto I/O pad 680 in test mode. However, in functional mode, signal outmode on path 651 would cause selection of input from internal logic 250.

Multiplexer 660 selects the signal on path 611 or the signal provided by multiplexer 650 based on test mode signal on path 661 provided by TAP port 270. The output of multiplexer 660 is provided to I/O pad 680 through I/O buffer 670.

The manner in which the components of above are operated to test components (670 and 675) at-speed, is described below with respect to FIG. 7.

8. Timing Diagram

Figure 7:
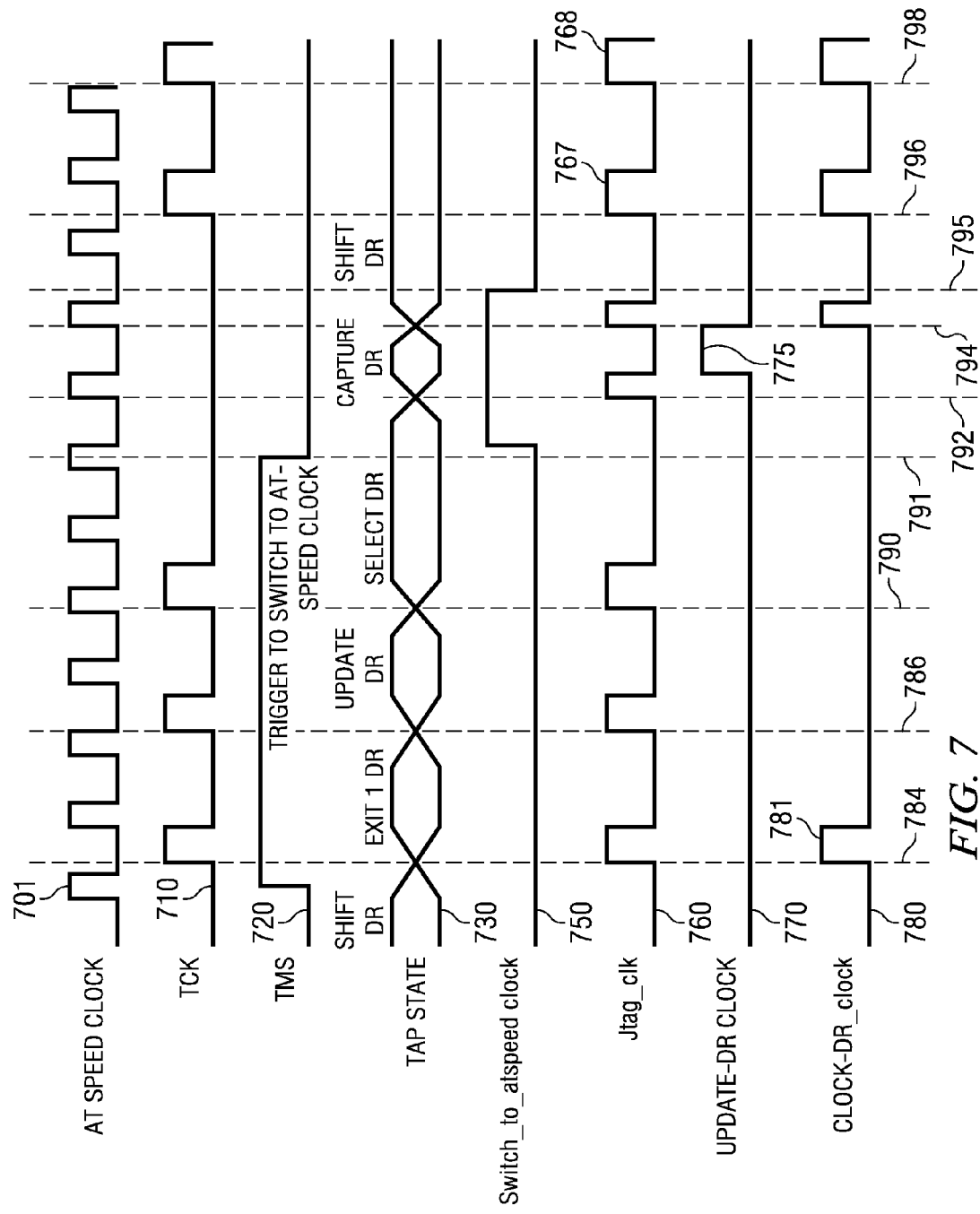
FIG. 7 is a timing diagram illustrating the timing relationship of various signals in an embodiment of the present invention.

FIG. 7 is a timing diagram illustrating the signals which need to be generated to test the components of an output path at-speed, in an embodiment of the present invention. The timing diagram is shown containing at-speed clock 701, TCK (transition clock) 710, TMS (test mode select) signal 720, TAP states 730, clock control 750, clock to TAP controller (TAG Clock) 760, updateDR clock 770, and clockDR clock 780. Each signal is described below in further detail.

At-speed clock 701 may be generated and provided by tester 110 or be received from an on-chip PLL (not shown). The frequency of the signal equals the approximate frequency at which the integrated circuit is desired to be operated, in normal (non test-mode) use.

TCK 710 represents the clock signal provided according to JTAG standard, and is used to time the transitions of the state machine (shown in FIG. 4) while at-speed clock is not selected by clock control signal 750. TCK 710 is thus used for clocking of the scan cells. TMS 720 indicates the specific durations in which the state transitions can occur (at time instances specified by TCK 710). Signals 701, 710, and 720 are generated and sent by tester 110.

TAP states 730 logically represents the present state of TAP controller 280 in each time instance. Clock control 750 represents a select signal to select either TCK 710 (on logic low) or at-speed clock 701 (on logic high) to be provided as clock signal to TAP port 270 in the corresponding time duration.

Clock to TAP controller 760 represents the specific one of the selected clocks (710 or 701) which is applied to TAP port 270 as a JTAG clock 760. The selection of the clock is performed according to clock control 750.

UpdateDR clock 770 represents the signal provided as clock input to latch data into update register 640. ClockDR clock 780 represents a clock signal provided to latch data into scan register 630. The manner in which signals 750, 770 and 780 can be generated in an embodiment, is described below with respect to FIG. 8.

The description is now continued with combined reference to FIGS. 4, 6 and 7, and is used to illustrate the manner in which the buffers are tested at-speed.

9. Operation for At-Speed Testing

Continuing with combined reference to FIGS. 4, 6 and 7, it is now assumed that TAP controller 270 is in shiftDR state 425, which can be attained by applying appropriate dummy signals on TMS 720 and TCK 710, in a known way.

At time instance 784, clockDR clock 780 is shown having pulse 781, which latches a desired data bit onto scan register 630. Clock control 750 is asserted to logic low, causing TCK 710 to be provided as JTAG clock 760 to TAP port 270. Since TMS 720 is shown at logic high, TAP controller 280 changes its state from shiftDR 425 to exitDR 430 consistent with the transition diagram of FIG. 4.

At time instance 786, JTAG clock 760 changes the state of tap controller 280 from exitDR 430 to updateDR 445 since TMS 720 is maintained at logic high. At time instance 790, JTAG clock 760 changes the state from updateDR 445 to selectDR 415 for the same reason.

At time instance 791, TMS 720 is shown transitioning to logic low, thereby enabling transition of TAP controller 280 from selectDR 415 to captureDR 420 at time instance 792 (i.e., rising edge of JTAG clock 760). Clock control signal 750 is shown transitioning from logic low to logic high after time point 791, thereby selecting at-speed clock pulses from at-speed clock signal 701 to be applied JTAG clock signal 760.

At time instance 792, pulse 765 is applied to TAP controller 280, thereby changing state of TAP controller 280 from selectDR 415 to captureDR 420. In captureDR state 420, updateDR clock pulse 775 is applied to launch the data onto the input of I/O buffer 670. Launching is performed by latching the data and setting the select signal of multiplexers 650 and 660 at logic high.

It should be appreciated that according to JTAG standard, the Update-DR clock is provided in the Update-DR state 445 of the State machine, but in the operation according to FIG. 7 the application of the Update-DR clock 770 is delayed such that the Update-DR clock 770 is applied in the Capture-DR state 420 of the State machine, to facilitate at-speed captures.

The output of I/O buffer 670 is received through I/O buffer 675, multiplexers 690, 610 and 620 at the input of scan register 630. The input value is latched onto scan register 630 at time instance 794 by clockDR clock pulse 782.

At time instance 795, clock control signal 750 is transitioned to 0, thereby connecting TCK clock 710 to JTAG clock 760. The latched input value is shifted out of scan chain by applying JTAG pulses 767 and 768 in shiftDR mode of TAP controller 280.

From the above, it may be appreciated that the launching and capturing of the response are performed at the rising edge of successive pulses 775 and 785 generated according to at-speed clock 701. Thus, I/O buffers 670 and 675 are tested at-speed as well.

In addition, the solution would be consistent with the operation of low cost testers which may not allow any inputs (to scan cells) to change during the at-speed clock application. This is done by maintaining the clock control signal to logic low during capture state.

However, signals 750, 760, 770 and 780 have been described as being used for such testing. The manner in which such signals can be generated from the other signals (otherwise generated by tester or tap controller), is described below.

10. Generating Additional Signals

Figure 8A:
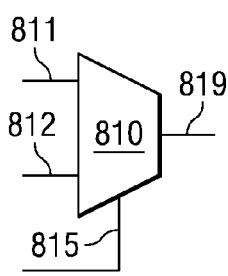
FIGS. 8A, 8B, 8C and 8D are circuit diagrams illustrating the manner in which the corresponding signals are generated in an embodiment.

FIG. 8A is a circuit diagram illustrating the manner in which JTAG signal 760 is generated in one embodiment. The circuit diagram is shown containing a multiplexer 810 receiving at-speed signal 701 on first input 811 and TCK 710 on second input 812. Select terminal 815 is shown receiving clock control 750. Multiplexer 810 provides TCK 710 and at-speed clock 701 on the output terminal respectively when clock control 750 is at logic low and logic high. The multiplexed signal on terminal 819 represents the JTAG clock 760.

Figure 8B:
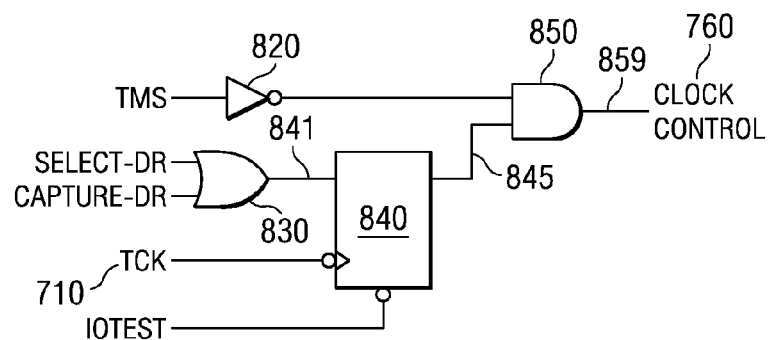

FIG. 8B is a circuit diagram illustrating the manner in which clock control 750 (select signal to multiplexer 810) is generated in one embodiment. The circuit diagram is shown containing NOT gate 820, OR gate 830, flip-flop 840 and AND gate 850. Each component is described below in further detail.

OR gate 830 receives selectDR status on one of the input and a captureDR status on the other input and generates a logic high when TAP controller 280 is either in selectDR state or in captureDR state and generates a logic low otherwise. The output of OR gate 830 is provided to flip-flop 840 on path 841.

Flip-flop 840 is shown receiving output of OR gate 830 on the data terminal and TCK 710 on clock in terminal. Flip-flop 840 latches the logical value on path 841 on to the output terminal 845 on the occurrence of negative clock edge of TCK 710. Accordingly, a logic high is provided on the path 845 during captureDR state starting at the falling edge of TCK 710 in the select DR state.

AND gate 850 receives output from the flip-flop 840 on one of the terminal and a inverted TMS 730 on the other terminal. TMS 730 is inverted using the inverter 820. The output of the AND gate 850 is provided as clock control 750. It may be appreciated that the logic high provided on the path 845 starting at the falling edge of TCK 710 in the select DR and until completion of captureDR state only when the TMS 730 is at logic low as shown in FIG. 7.

Figure 8C:
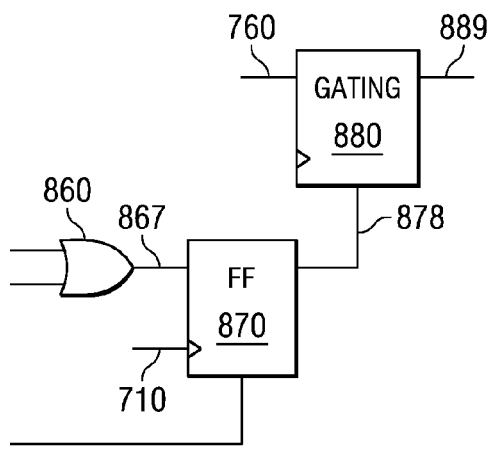

FIG. 8C is a circuit diagram illustrating the manner in which clockDR 780 in FIG. 7 may be generated. Circuit diagram is shown containing OR gate 860, flip-flop 870 and a gating logic 880. Each component is described below in further detail.

OR gate 860 receives shiftDR status on one of the input and a captureDR status on the other input and generates a logic high when TAP controller 280 is either in shiftDR state or in captureDR state and generates a logic low otherwise. The output of OR gate 860 is provided to flip-flop 870 on path 867.

Flip-flop 870 is shown receiving output of OR gate 860 on the data terminal and JTAG clock 760 on clock in terminal. Flip-flop 870 latches the logical value on path 867 on to the output terminal 878 on the occurrence of negative clock edge of JTAG clock 760. Gating logic 880 generates clockDR signal on path 889 and is shown receiving JTAG clock 760 on the input and a gate control signal on path 878.

Gating logic 880 provides the received JTAG clock 760 on output terminal 889 when a gate control signal is at logic high and provides a logic low when the gate control signal is at logic low. As a result, clockDR 780 is provided as shown in FIG. 7.

Figure 8D:
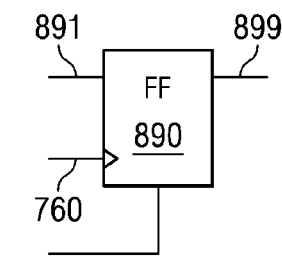

FIG. 8D is a circuit diagram illustrating the manner in which signal updateDR 770 is generated in one embodiment of the present invention. The flip-flop 890 is shown receiving the captureDR status on the data input and JTAG clock 760 on the clock input. Flip flop 890 generates the updateDR clock 770 on the out put terminal 899. Flip flop 890 latches the data input on to the output terminal 899 on the occurrence of the falling edge. As a result, during the captureDR state, the falling edge of the JTAG clock pulse 765 causes a transition to logic high and the end of captureDR state at time instance 794 causes the transition from high to low as depicted in FIG. 7.

The circuits of FIGS. 8A-8D may be incorporated as a part of tap port and the control signals may be provided to each of the boundary scan cells. Thus, using the boundary scan cells and tap port details thus described, a tester may cause appropriate signals to be generated to test the components of I/O paths at-speed. The features of the tester may be operative by execution of appropriate software instructions, as described below in further detail.

11. Tester Implementation in Software

Figure 9:
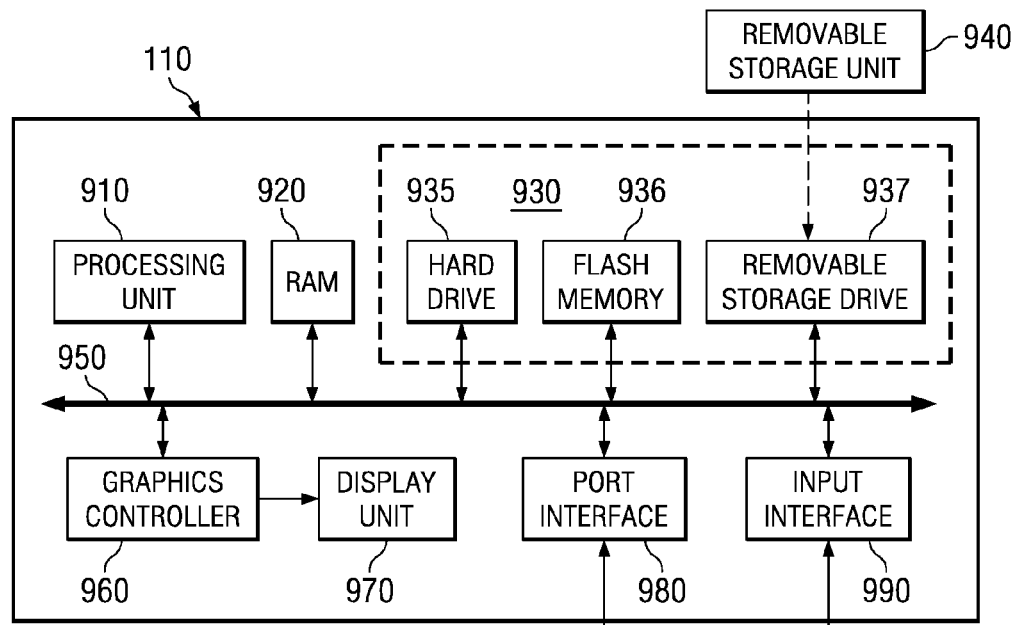
FIG. 9 is a block diagram illustrating the details of a tester in which several aspects of the present invention are operative upon execution of software instructions.

FIG. 9 is a block diagram illustrating the details of an example tester system 110 for testing integrated circuits as described above. Tester system 110 may contain one or more processors such as central processing unit (CPU) 910, random access memory (RAM) 920, secondary memory 930, graphics controller 960, display unit 970, port interface 980, and input interface 990. The components of FIG. 9 are described below in further detail.

CPU 910 may execute instructions stored in RAM 920 to provide several features of the present invention (by performing tasks corresponding to various approaches described above). CPU 910 may contain multiple processing units, with each processing unit potentially being designed for a specific task. Alternatively, CPU 910 may contain only a single processing unit. RAM 920 may receive instructions from secondary memory 930 using communication path 950.

Graphics controller 960 generates display signals (e.g., in RGB format) to display unit 970 based on data/instructions received from CPU 910. Display unit 970 contains a display screen to display the images defined by the display signals. Input interface 990 may correspond to a key-board and/or mouse, and generally enables a user to provide inputs. Port interface 980 contains bus 150 described above, and facilitates exchange (send/receive) of various signals with the integrated circuits sought to be tested.

Secondary memory 930 may contain hard drive 935, flash memory 936 and removable storage drive 937. Secondary storage 930 may store the software instructions (which perform the actions specified by various flow charts above) and data (e.g., test data, instruction sets, etc.), which enable tester system 110 to provide several features in accordance with the present invention. Some or all of the data and instructions may be provided on removable storage unit 940, and the data and instructions may be read and provided by removable storage drive 937 to CPU 910. Floppy drive, magnetic tape drive, CD-ROM drive, DVD Drive, Flash memory, removable memory chip (PCMCIA Card, EPROM) are examples of such removable storage drive 937.

Removable storage unit 940 may be implemented using medium and storage format compatible with removable storage drive 937 such that removable storage drive 937 can read the data and instructions. Thus, removable storage unit 940 includes a computer (used synonymous with machine) readable storage medium having stored therein computer software and/or data. An embodiment of the present invention is implemented using software running (that is, executing) in tester system 110.

In this document, the term "computer program product" is used to generally refer to removable storage unit 940 or hard disk installed in hard drive 935. These computer program products are means for providing software to tester system 110. As noted above, CPU 910 may retrieve the software instructions, and execute the instructions to provide various features of the present invention.

12. Conclusion

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. A method of testing an integrated circuit containing a plurality of input/output (I/O) paths, each of said I/O paths being provided between corresponding a I/O pad and an internal functional logic also contained in said integrated circuit, each of said I/O paths containing a corresponding conductor, a corresponding scan cell and a corresponding component, said method comprising:

placing said scan cells in the form of a chain, wherein said scan cells contain a first scan cell having a first component as said corresponding component;

scanning-in a scan vector to set each of said scan cells to a corresponding bit value, wherein said first scan cell is set to a first value;

launching said first value on to said first component from said first scan cell at a first time instance;

capturing in a register an output of said first component at a second time instance, wherein said second time instance is timed to correspond to an at-speed operation of said integrated circuit;

comparing said output with an expected value to determine whether said first component is operating accurately at said at-speed operation.

2. The method of claim 1, wherein said launching, said capturing and said comparing are performed for each of said plurality of scan cells using said corresponding bit value of said scan vector.

3. The method of claim 1, wherein each of said first time instance and said second time instance are determined by an edge of a corresponding pulse.

4. The method of claim 1, wherein said component comprises a buffer.

5. A computer readable medium carrying one or more sequences of instructions for enabling a tester to test an integrated circuit containing a plurality of input/output (I/O) paths, each of said I/O paths being provided between corresponding a I/O pad and an internal functional logic also contained in said integrated circuit, each of said I/O paths containing a corresponding conductor, a corresponding scan cell and a corresponding component, wherein execution of said one or more sequences of instructions by one or more processors contained in a system causes said one or more processors to perform the actions of:

placing said scan cells in the form of a chain, wherein said scan cells contain a first scan cell having a first component as said corresponding component;

scanning-in a scan vector to set each of said scan cells to a corresponding bit value, wherein said first scan cell is set to a first value;

launching said first value on to said first component from said first scan cell at a first time instance;

capturing in a register an output of said first component at a second time instance, wherein said second time instance is timed to correspond to an at-speed operation of said integrated circuit;

comparing said output with an expected value to determine whether said first component is operating accurately at said at-speed operation.

6. An integrated circuit containing:

a plurality of input/output (I/O) pads;

a functional internal logic;

a plurality of components, each component being located in an I/O path provided between a corresponding one of said I/O pads and said functional internal logic; and a plurality of scan cells designed to be connected as a scan chain, each of said plurality of scan cells being connected to send a data bit to a corresponding one of said plurality of components at a first time instance and latch an output received from said component at a second time instance, wherein said first time instance and said second time instance are timed to correspond to an at-speed operation of said integrated circuit such that each of said plurality of scan cells is used to test said corresponding one of said plurality of components at said at-speed operation.

7. The integrated circuit of claim 6, herein a first scan cell contained in said plurality of scan cells tests a first component contained in said plurality of components, said first scan cell comprises:

a first register launching said data bit on a path connecting to said first component at said first time instance; and a second register latching a signal received from said first component at said second time instance, wherein said signal latched in said second register is compared with an expected value to determine whether said first component is operating accurately at said at-speed operation.

8. The integrated circuit of claim 7, wherein said first time instance is at an edge of a first pulse and said second time instance is at an edge of a second pulse.

9. The integrated circuit of claim 8, wherein said second register receives a scan bit from a previous scan cell of said scan chain in a scan-in mode and receives said output from said first component in an at-speed test mode.

10. The integrated circuit of claim 9, wherein said first pulse and said second pulse are applied in a capture state according to the JTAG standard.

* * * * *